United States Patent
Lin et al.

(10) Patent No.: US 6,734,563 B2
(45) Date of Patent: May 11, 2004

(54) POST PASSIVATION INTERCONNECTION SCHEMES ON TOP OF THE IC CHIPS

(75) Inventors: Mou-Shiung Lin, Hsinchu (TW); Jin-Yuan Lee, Hsin-Chu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 10/278,106

(22) Filed: Oct. 22, 2002

(65) Prior Publication Data

US 2003/0057531 A1 Mar. 27, 2003

Related U.S. Application Data

(62) Division of application No. 09/691,497, filed on Oct. 18, 2000, now Pat. No. 6,495,442.

(51) Int. Cl.$^7$ ................................................. H01L 23/48
(52) U.S. Cl. ........................ 257/773; 257/690; 257/700; 257/774
(58) Field of Search ................................. 257/700, 690, 257/691, 920, 773, 774; 438/614, 615, 616, 622

(56) References Cited

U.S. PATENT DOCUMENTS

| | | | |
|---|---|---|---|
| 5,055,907 A | 10/1991 | Jacobs | 357/71 |
| 5,106,461 A | 4/1992 | Volfson et al. | 205/125 |
| 5,212,403 A | 5/1993 | Nakanishi et al. | 257/664 |
| 5,501,006 A | 3/1996 | Gehman, Jr. et al. | 29/840 |
| 5,635,767 A | 6/1997 | Wenzel et al. | 257/778 |
| 5,686,764 A | 11/1997 | Fulcher | 527/778 |
| 5,701,666 A * | 12/1997 | DeHaven et al. | 438/117 |
| 6,168,974 B1 * | 1/2001 | Chang et al. | 438/652 |
| 6,180,426 B1 * | 1/2001 | Lin | 438/15 |
| 6,303,423 B1 * | 10/2001 | Lin | 438/238 |
| 6,306,749 B1 * | 10/2001 | Lin | 438/612 |
| 6,455,885 B1 * | 9/2002 | Lin | 257/300 |
| 6,515,369 B1 * | 2/2003 | Lin | 257/773 |

* cited by examiner

*Primary Examiner*—Kevin M. Picardat
(74) *Attorney, Agent, or Firm*—George O. Saile; Stephen B. Ackerman

(57) ABSTRACT

A new method is provided for the creation of interconnect lines. Fine line interconnects are provided in a first layer of dielectric overlying semiconductor circuits that have been created in or on the surface of a substrate. A layer of passivation is deposited over the layer of dielectric, a thick second layer of dielectric is created over the surface of the layer of passivation. Thick and wide interconnect lines are created in the thick second layer of dielectric. The first layer of dielectric may also be eliminated, creating the wide thick interconnect network on the surface of the layer of passivation that has been deposited over the surface of a substrate.

23 Claims, 5 Drawing Sheets

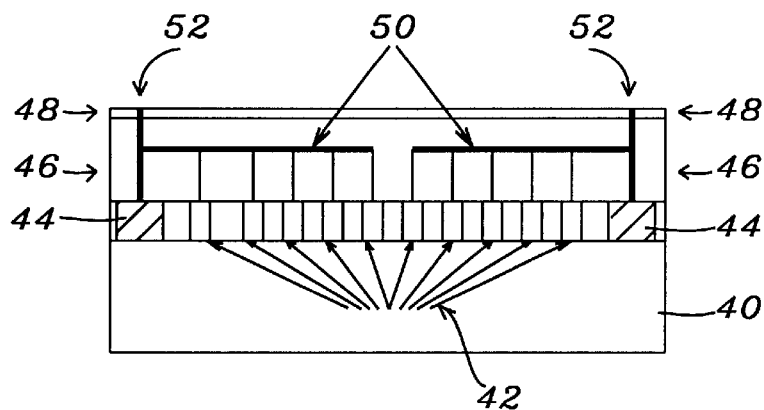
FIG. 1 – Prior Art
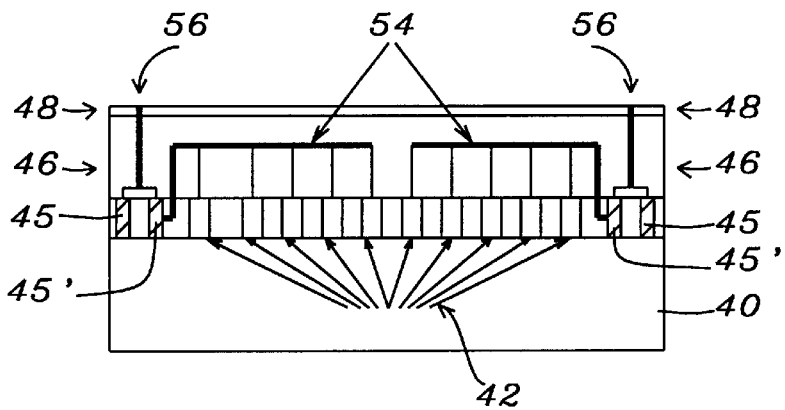
FIG. 2 – Prior Art
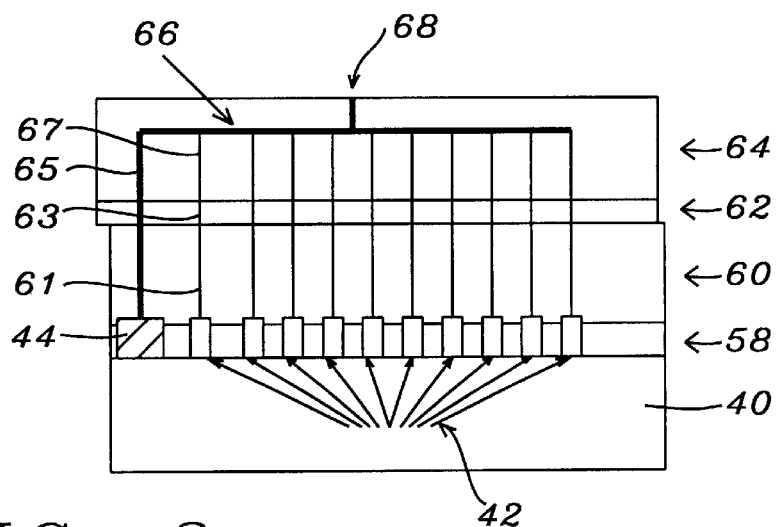
FIG. 3a

POST PASSIVATION INTERCONNECTION SCHEMES ON TOP OF THE IC CHIPS

RELATED PATENT APPLICATIONS

This is a division of patent application Ser. No. 09/691,497, filing date Oct. 18, 2000, now U.S. Pat. No. 6,495,442, Post Passivation Interconnection Schemes On Top Of Ic Chips, assigned to the same assignee as the present invention.

This application is related to Ser. No. 09/251,183 filed on Feb. 17, 1999 which is a continuation-in-part of Ser. No. 09/216,791 filed on Dec. 21, 1998, assigned to a common assignee. This application is also related to Ser. No. 09/721,722, filing date Nov. 27, 2000, now U.S. Pat. No. 6,303,423.

BACKGROUND OF THE INVENTION (1) Field of the Invention

The invention relates to the fabrication of integrated circuit devices, and more particularly, to a method of post-passivation processing for the creation of conductive interconnects.

(2) Description of the Prior Art

Improvements in semiconductor device performance are typically obtained by scaling down the geometric dimensions of the Integrated Circuits, this results in a decrease in the cost per die while at the same time some aspects of semiconductor device performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, one approach has been is to develop low resistance metal (such as copper) for the wires while low dielectric materials are used in between signal lines. Current practice is to create metal interconnection networks under a layer of passivation, this approach however limits the interconnect network to fine line interconnects and the therewith associated how parasitic capacitance and high line resistivity. The latter two parameters, because of their relatively high values, degrade device performance, an effect which becomes even more severe for higher frequency applications and for long interconnect lines that are, for instance, used for clock distribution lines. Also, fine line interconnect metal cannot carry high values of current that is typically needed for ground busses and for power busses.

It has previously been stated that it is of interest to the semiconductor art to provide a method of creating interconnect lines that removes typical limitations that are imposed on the interconnect wires, such as unwanted parasitic capacitances and high interconnect line resistivity. The invention provides such a method. An analogy can be drawn in this respect whereby the currently (prior art) used fine-line interconnection schemes, which are created under a layer of passivation, are the streets in a city; in the post-passivation interconnection scheme of the present invention, the interconnections that are created above a layer of passivation can be considered the freeways between cities.

FIG. 1 shows a cross section of a silicon substrate on the surface of which has been created a conductive interconnect network. The structure that is shown in cross section in FIG. 1 addresses only and is limited to prior art power and ground distribution networks. The various features that have been highlighted in FIG. 1 are the following:

- 40, a silicon substrate on the surface of which has been created an interconnect network
- 42, a sample number of semiconductor circuits that have been created in or on the surface of the substrate 40
- 44, two electrostatic discharge (ESD) circuits created in or on the surface of the substrate 40, one ESD circuit is provided for each pin that is accessible for external connections (pins 52, see below)
- 46 is a layer of interconnect lines; these interconnect lines are above the surface of substrate 40 and under the layer 48 of passivation and represent a typical application of prior art fine-line interconnects; these fine-line interconnect of layer 46 typically have high resistivity and high parasitic capacitance
- 48 is a layer of passivation that is deposited over the surface of the layer 46 of interconnect lines
- 50 is a power or ground bus that connects to the circuits 42 via fine-line interconnect lines provided in layer 46; this power or ground bus is typically of wider metal since this power or ground bus carries the accumulated current or ground connection for the devices 42
- 52 is a power or ground pin that passes through the layer 48 of passivation and that has been connected to the power or ground bus 50.

From the above the following can be summarized: circuits are created in or on the surface of a silicon substrate, interconnect lines are created for these circuits for further interconnection to external circuitry, the circuits are, on a per I/O pin basis, provided with an ESD circuit, these circuits with their ESD circuit are connected to a power or ground pin that penetrates a layer of passivation. The layer of passivation is the final layer that overlies the created interconnect line structure, the interconnect line underneath the layer of passivation are fine line interconnects and have all the electrical disadvantages of fine line interconnects such as high resistivity and high parasitic capacitance.

Relating to the cross section that is shown in FIG. 1, the following comments applies: ESD circuits are, as is known in the art, provided for the protection of semiconductor circuits against unexpected electrical charges. For this reason, each pin that connects to a semiconductor circuit must be provided with an ESD circuit.

FIG. 2 shows a cross section of a prior art configuration that resembles the cross section shown in FIG. 1. The structure that is shown in cross section in FIG. 2 however addresses only and is limited to clock and signal distribution networks. FIG. 2 shows in addition (to the previously highlighted aspects of FIG. 1):

- 45 are two ESD circuits that are provided in or on the surface of the substrate 40; ESD circuits are always required for any external connection to an input/output (I/O) pin
- 45' which are circuits that can be receiver or driver or I/O circuits for input (receiver) or output (driver) or I/O purposes respectively
- 54 is a clock bus
- 56 is a clock or signal pin that has been extended through the layer 48 of passivation.

The same comments apply to the cross section that is shown in FIG. 2 as previously have been made with respect to FIG. 1, with as a summary statement that the layer of passivation is the final layer that overlies the created structure, the interconnect lines underneath the layer of passivation are fine line interconnects and have all the electrical disadvantages of fine line interconnects such as high resistivity and high parasitic capacitance.

Further applies to the cross section that is shown in FIG. 2, where pins 56 are signal or clock pins:

pins 56 must be connected to ESD and driver/receiver or I/O circuits 45 for signal or clock pins 56, these pins must be connected not only to ESD circuits but also to driver or receiver or I/O circuits, highlighted as circuit 45' in FIG. 2 after (clock and signal) stimuli have passed through the ESD and driver/receiver or I/O circuits, these stimuli are further routed using, under prior art methods, fine-line interconnect wires. A layer of passivation is deposited over the dielectric layer in which the interconnect network has been created.

It is therefore of interest to the semiconductor art to provide a method of creating interconnect lines that removes typical limitations that are imposed on the interconnect wires, such as unwanted parasitic capacitances and high interconnect line resistivity.

SUMMARY OF THE INVENTION

A principal objective of the invention is to provide a method for the creation of interconnect metal that allows for the use of thick and wide metal.

Another objective of the invention is to provide a method for the creation of interconnect metal that uses the application of thick layer of dielectric such as polymer.

Yet another objective of the invention is to provide a method that allows for the creation of long interconnect lines, whereby these long interconnect lines do not have high resistance or introduce high parasitic capacitance.

A still further objective of the invention is to create interconnect lines that can carry high values of current for the creation of power and ground distribution networks.

A still further objective of the invention is to create interconnect metal that can be created using cost effective methods of manufacturing by creating the interconnect metal on the surface of and after a layer of passivation has been deposited.

In accordance with the objectives of the invention a new method is provided for the creation of interconnect lines. Fine line interconnects are provided in a first layer of dielectric overlying semiconductor circuits that have been created in or on the surface of a substrate. A layer of passivation is deposited over the layer of dielectric, a thick second layer of dielectric is created over the surface of the layer of passivation. Thick and wide interconnect lines are created in the thick second layer of dielectric.

BRIEF DESCRIPTION OF THE DRAWINGS

FIG. 1 is a cross section of a silicon substrate over which a prior art fine-line interconnect network is created over which a layer of passivation is deposited, power and/or ground pins are provided through the layer of passivation for external connection. The structure that is shown in cross section in FIG. 1 addresses only and is limited-to prior art power and ground distribution networks.

FIG. 2 is a cross section of a silicon substrate over which a prior art fine-line interconnect network is created over which a layer of passivation is deposited, clock and/or signal pins are provided through the layer of passivation for external connection. The structure that is shown in cross section in FIG. 2 addresses only and is limited to prior art clock and signal distribution networks.

FIG. 3a is a cross section of a silicon substrate over which an interconnect network is created according to the invention. Power and/or ground pins are provided through the surface of the layer of dielectric for external connection. The structure that is shown in cross section in FIGS. 3a and 3b addresses only and is limited to power and ground distribution networks of the invention.

DESCRIPTION OF THE PREFERRED EMBODIMENTS

Figure 6:
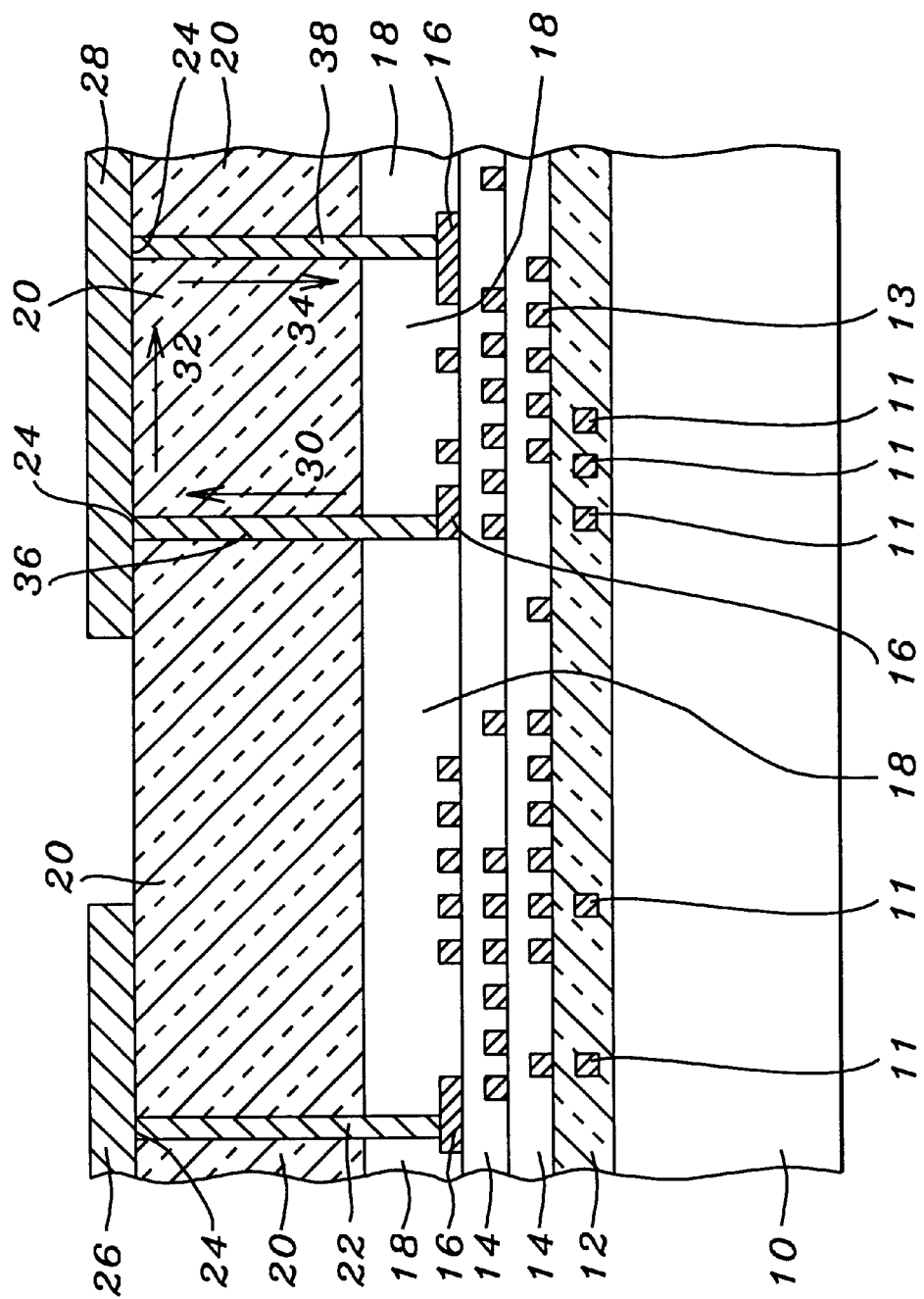
FIG. 6 shows a cross section of the interconnection scheme of the referenced continuation-in-part application invention.

For purposes of reference and for clarity of understanding, FIG. 6, is taken from related application U.S. patent application Ser. No. 09/251,183 and is herein incorporated by reference.

Referring now more specifically to FIG. 6, there is shown a cross section of one implementation of the referenced application. The surface of silicon substrate 10 has been provided with transistors and other devices (not shown in FIG. 6). The surface of substrate 10 is covered by a dielectric layer 12, layer 12 of dielectric is therefore deposited over the devices that have been provided in the surface of the substrate and over the substrate 10. Conductive interconnect lines 11 are provided inside layer 12 that connect to the semiconductor devices that have been provided in the surface of substrate 10.

Layers 14 (two examples are shown) represent all of the metal layers and dielectric layers that are typically created on top of the dielectric layer 12, layers 14 that are shown in FIG. 6 may therefore contain multiple layers of dielectric or insulation and the-like, conductive interconnect lines 13 make up the network of electrical connections that are created throughout layers 14. Overlying and on the surface of layers 14 are points 16 of electrical contact. These points 16 of electrical contact can for instance be bond pads that establish the electrical interconnects to the transistors and other devices that have been provided in the surface of the substrate 10. These points of contact 16 are points of interconnect within the IC arrangement that need to be further connected to surrounding circuitry. A passivation layer 18, formed of for example silicon nitride, is deposited over the surface of layer 14 to protect underlying layers from moisture, contamination, etc.

The key steps of the above referenced application begin with the deposition of a thick layer 20 of polyimide that is deposited over the surface of layer 18. Access must be provided to points of electrical contact 16, for this reason a pattern of openings 22, 36 and 38 is etched through the polyimide layer 20 and the passivation layer 18, the pattern of openings 22, 36 and 38 aligns with the pattern of electrical contact points 16. Contact points 16 are, by means of the openings 22/36/38 that are created in the layer 20 of polyimide, electrically extended to the surface of layer 20.

The above referenced material that is used for the deposition of layer 20 is polyimide, the material that can be used for this layer is not limited to polyimide but can contain any of the known polymers ($SiCl_xO_y$). The indicated polyimide is the preferred material to be used for the processes of the invention for the thick layer 20 of polymer. Examples of polymers that can be used are silicons, carbons, fluoride, chlorides, oxygens, silicone elastomer, parylene or teflon, polycarbonate (PC), polysterene (PS), polyoxide (PO), poly polooxide (PPO), benzocyclobutene (BCB)

Electrical contact with the contact points 16 can now be established by filling the openings 22/36/38 with a conductive material. The top surfaces 24 of these metal conductors that are contained in openings 22/36/38 can now be used for connection of the IC to its environment, and for further integration into the surrounding electrical circuitry. This latter statement is the same as saying the semiconductor devices that have been provided in the surface of substrate 10 can, via the conductive interconnects contained in openings 22/36/38, be further connected to surrounding components arid circuitry. Interconnect pads 26 and 28 are formed on top of surfaces 24 of the metal interconnects contained in openings 22, 36 and 38. These pads 26 and 28 can be of any design requirements. A pad can, for instance, be used as a flip chip pad. Other pads can be used for power distribution or as a ground or signal bus. The following connections can, for instance, be made to the pads shown in FIG. 6: pad 26 can serve as a flip chip pad, pad 28 can serve as a flip chip pad or can be connected to electrical power or to electrical ground or to an electrical signal bus. There is no connection between the size of the pads shown in FIG. 6 and the suggested possible electrical connections for which this pad can be used. Pad size and the standard rules and restrictions of electrical circuit design determine the electrical connections to which a given pad lends itself.

The following comments relate to the size and the number of the contact points 16, FIG. 6. Because these contact points 16 are located on top of a thin dielectric (layer 14, FIG. 6) the pad size cannot be too large since a large pad size brings with it a large capacitance. In addition, a large pad size will interfere with the routine capability of that layer of metal. It is therefore preferred to keep the size of the pad 16 relatively small. The size of pad 16 is however also directly related with the aspect ratio of vias 22/36/38. An aspect ratio of about 5 is acceptable for the consideration of via etching and via filling. Based on these considerations, the size of the contact pad 16 can be in the order of 0.5 $\mu$m to 30 $\mu$m, the exact size being dependent on the thickness of layers 18 and 20.

For higher aspect ratio vias, the vias are filled with via plugs before the deposition of the metal layers 26 and 28. However, for vias that have lower aspect ratios (for example less than 2), the via plugs may not be needed in which case the metal of layers 26 and 28 can directly establish contact with the pads 16.

The referenced application does not impose a limitation on the number of contact pads that can be included in the design, this number is not only dependent on package design requirements but is mostly dependent on the internal circuit design requirements of the package. Layer 18 in FIG. 6 can be a typical IC passivation layer.

The most frequently used passivation layer in the present state of the art is plasma enhanced CVD (PECVD) oxide and nitride. In creating layer 18 of passivation, a layer of approximately 0.5 um. PECVD oxide can be deposited first followed by a layer of approximately 0.7 um. nitride. Passivation layer 18 is very important because it protects the device wafer from moisture and foreign ion contamination. The positioning of this layer between the sub-micron process (of the integrated circuit) and the lens-micron process (of the interconnecting metalization structure) is of critical importance since it allows for a cheaper process that possibly has less stringent clean room requirements for the process of creating the interconnecting metalization structure.

Layer 20 is a thick polymer dielectric layer (for example polyimide) that have a thickness in excess of 2 um (after curing). The range of the polymer thickness can vary from 2 um. to 150 um, dependent on electrical design requirements.

For the deposition of layer 20 the Hitachi-Dupont polyimide HD 2732 or 2734 can, for example, be used. The polyimide can be spin-on coated and cured. After spin-on coating, the polyimide will be cured at 400 degrees C. for 1 hour in a vacuum or nitrogen ambient. For thicker polyimide, the polyimide film can be multiple coated and cured.

Another material that can be used to create layer 20 is the polymer benzocyclobutene (BCB). This polymer is at this time commercially produced by for instance Dow Chemical and has recently gained acceptance to be used instead of typical polyimide application.

The dimensions of openings 22, 36 and 38 have previously been discussed. The dimension of the opening together with the dielectric thickness determine the aspect ratio of the opening. The aspect ratio challenges the via etch process and the metal filling capability. This leads to a diameter for openings 22/36/38 in the range of approximately 0.5 um. to 30 um. the height for openings 22/36/38 can be in the range of approximately 2 um. to 150 um. The aspect ratio of openings 22/36/38 is designed such that filling of the via with metal can be accomplished. The via can be filled with CVD metal such as CVD tungsten or CVD copper, with electro-less nickel, with a damascene metal filling process, with electroplating copper, etc. As previously stated, for low aspect ratio vias, the filling of the vias is not required as an extra processing step. A direct contact can be established between the metal layers 26 and 28 and the contact pads 16.

The referenced application can be further extended by applying multiple layers of polymer (such as polyimide) and can therefore be adapted to a larger variety of applications. The function of the structure that has been described in FIG. 6 can be further extended by depositing a second layer of polyimide on top of the previously deposited layer 20 and overlaying the pads 26 and 28. Selective etching and metal deposition or electro plating of metal can further create additional contact points on the surface of the second layer of polyimide that can be interconnected with pads 26 and 28. Additional layers of polyimide and the thereon created contact pads can be customized to a particular application, the indicated extension of multiple layers of polyimides greatly enhances the flexibility and usefulness of the referenced continuation-in-part application.

FIG. 6 shows a basic design advantage of the referenced continuation-in-part application. This advantage allows for the sub-micron or fine-lines, that run in the immediate vicinity of the metal layers 14 and the contact points 16, to be extended in an upward direction 30 through metal interconnect 36, this extension continues in the direction 32 in the horizontal plane of the metal interconnect 28 and comes back down in the downward direction 34 through metal interconnect 38. The functions and constructs of the passivation layer 18 and the insulating layer 20 remain as previously highlighted. This basic design advantage of the invention is to "elevate" or "fan-out" the fine-line interconnects and to remove these interconnects from the micro and sub-micro level to a metal interconnect level that has considerably larger dimensions and that therefore has smaller resistance and capacitance and is easier and more cost effective to manufacture. This aspect of the referenced application does not include any aspect of pad re-distribution and therefore has an inherent quality of simplicity. It therefore further adds to the importance of the referenced application in that it makes micro and sub-micro wiring accessible at a wide and thick metal level. The interconnections 22, 36 and 38 interconnect the fine-level metal by going up through the passivation and polymer or polyimide dielectric layers, continuing over a distance on the wide and thick metal level and continuing by descending from the wide and thick metal level back down to the fine-metal level by again passing down through the passivation and polymer or polyimide dielectric layers. The extensions that are in this manner accomplished need not to be limited to extending fine-metal interconnect points 16 of any particular type, such as signal or power or ground, with wide and thick metal line 26 and 28. The laws of physics and electronics will impose limitations, if any, as to what type of interconnect can by established in this manner, limiting factors will be the conventional electrical limiting factors of resistance, propagation delay, RC constants and others. Where the referenced application is of importance is that the references continuation-in-part application provides much broader latitude in being able to apply these laws and, in so doing, provides a considerably extended scope of the application and use of Integrated Circuits and the adaptation of these circuits to a wide and thick metal environment.

This completes the discussion of the construct shown for purposes of reference in FIG. 6. Following will further be discussed the cross sections that are shown in FIGS. 7a and 7b.

Figure 7A:
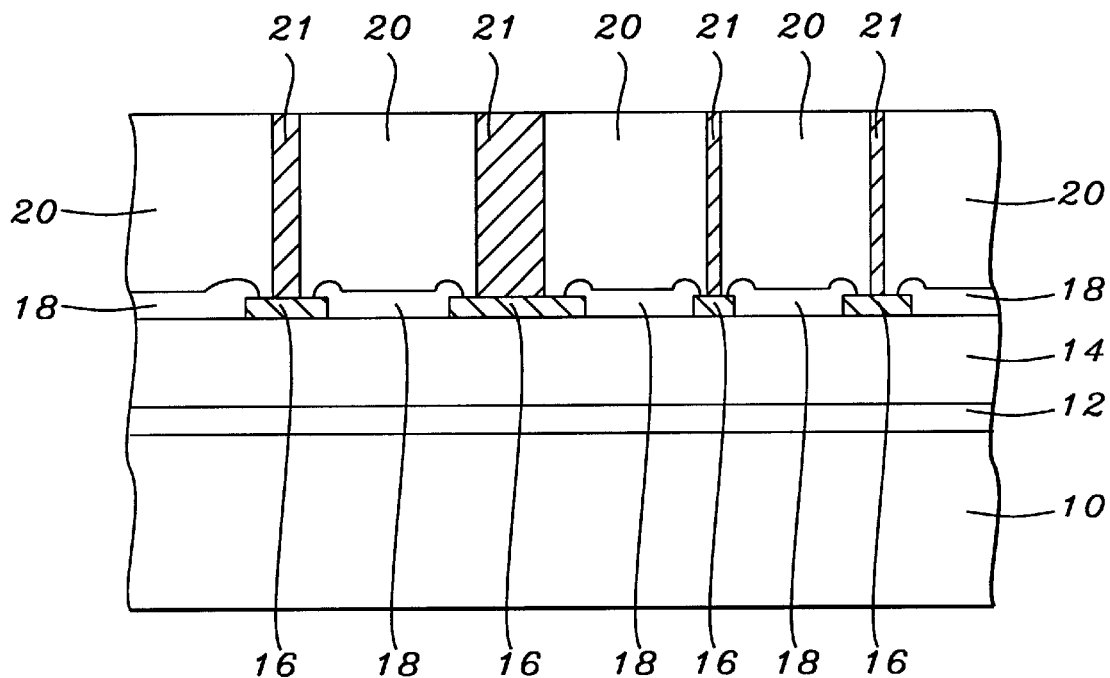
FIG. 7a shows a cross section of a simplified version of the substrate and the layers that are created on the surface of the substrate under the processes of the referenced continuation-in-part application.
Figure 7B:
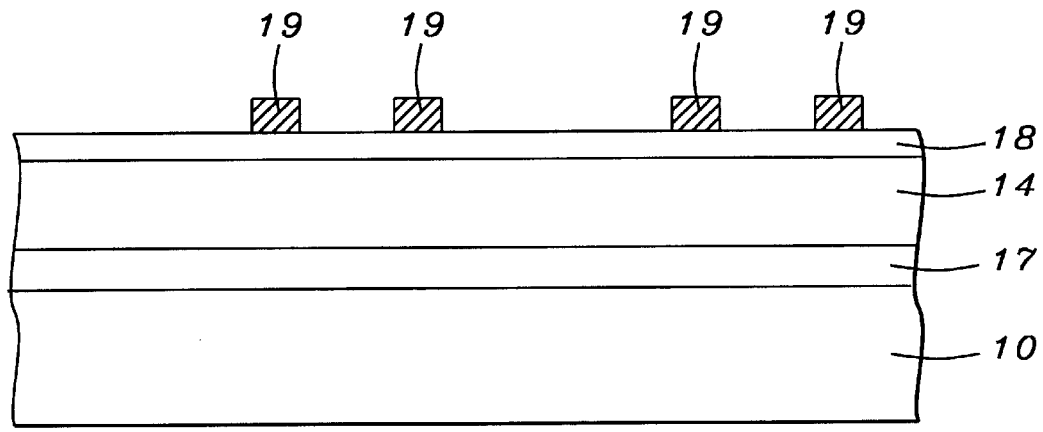
FIG. 7b shows the cross section of FIG. 7a where an inductor has been added above the layer of passivation.

FIG. 7a shows, for reasons of clarity, a simplified cross section of the substrate and the layers that are created on the surface of the substrate under the processes of the invention, the highlighted areas that are shown have previously been identified as:

10 the silicon substrate 12 is a layer of dielectric that has been deposited over the surface of the substrate 14 is an interconnect layer that contains interconnect lines, vias and contact points 16 are the contact points on the surface of the interconnect layer 14

18 is a layer of passivation into which openings have been created through which the contact points 16 can be accessed 20 is a thick layer of polymer, and 21 are the conductive plugs that have been provided through the layer 20 of polyimide.

The thick layer 20 of polymer can be coated in liquid form on the surface of the layer 18 of passivation or can be laminated over the surface of layer 18 of passivation by dry film application. Vias that are required for the creation of conductive plugs 21 can be defined by conventional processes of photolithography or can be created using laser (drill) technology.

It is clear from previous discussions that the sequence of layers that is shown in cross section in FIG. 7a has been created so that additional electrical components such as an inductor, a capacitor and the like can be created on the surface of layer 20 of polyimide and in electrical contact with conductive plugs 21. Layer 12 of dielectric may, in the cross section that is shown in FIG. 7a, be part of layer 14 since layer 14 is a layer of Intra Level Dielectric (ILD) within which layer 12 can be readily integrated.

With respect to the cross section that is shown in FIG. 7b, the same layers that have been identified for FIG. 7a are again provided in this cross section. Additionally has been shown the upper layer 17 of the silicon substrate 10 that contains active semiconductor devices. Also shown is cross section of an inductor 19 that has been created on the surface of layer 18 of passivation. It must again be emphasized that the ohmic resistivity of the metal that is used for the inductor 19 must be as low as possible. For this reason, the use of a thick layer of for instance gold is preferred for the formation of inductor 19, it has been shown that a thick layer of gold increased the Q value of inductor 19 from about 5 to about 20 for 2.4 GHz applications which represents a significant improvement in the Q value of inductor 19.

Referring now specifically to FIG. 3a, this figure refers only to power and ground pins and does not address signal or clock pins. There is shown in FIG. 3a a cross section of a silicon substrate 40 over which a interconnect network is created according to the invention, with a wide and thick wire interconnect network created in a thick layer of dielectric overlying a layer of passivation. A power and/or ground pin is provided through the surface of the thick layer of dielectric for external connection. Following are the various features that are shown in FIG. 3a:

40 is the silicon substrate on the surface of which interconnect lines are created in accordance with the invention 42 are semiconductor circuits that are created in or on the surface of substrate 40

44 is an ESD circuit that is provided for the protection of circuits 42

58 are connection pads to the semiconductor devices 42 that have been created in or on the surface of substrate 40

60 is a layer of fine-line interconnects that has been created overlying connection pads 58 to the semiconductor devices 42

61 is one of the vias that have been provided in layer 60, more such vias are shown in FIG. 3a but are, for reasons of simplicity, not highlighted 62 is a layer of passivation that has been deposited overlying the layer 60 of fine-line interconnects 63 is one of vias that passes through layer 62 of passivation, more such vias are shown in FIG. 3a but are, for reasons of simplicity, not highlighted 64 is a layer of dielectric in which, as a post-passivation process, interconnects have been created 65 is a power or ground bus that is connected to the ESD circuit 44, originating in layer 64 and further passing through layers 62 and 60

66 is the combined (for multiple connection pads in layer 58) power or ground bus 67 is a via that is created overlying the layer 62 of passivation, more such vias are shown in FIG. 3a but are, for reasons of simplicity, not highlighted 68 is the power of ground pin for the multiple semiconductor devices in layer 58.

From the cross section that is shown in FIG. 3a, its is clear that, most importantly, the ability to create interconnects to semiconductor devices that have been created in or on the surface of a substrate has been extended by creating these interconnects not only in as fine-line interconnects in layer 60 but extending the interconnect by creation a wide, thick wire interconnect network overlying a layer of passivation. This provides immediate and significant benefits in that these lines are further removed from the surface of the substrate (reducing parasitic influences by the interconnect lines on the semiconductor devices that are created in or on the surface of the substrate) while the interconnect network that is created overlying the layer of passivation can now contains sturdier, that is thicker and wider, interconnect lines. The thick, wide metal interconnects can be used for power and ground distribution, this distribution than takes place above a layer of passivation and partially replaces and extends the conventional method of having for these purposes a fine-line distribution interconnect network under the layer of passivation.

Some points of interest can be listed at this time as they relate to prior art methods and to the invention.

Prior Art:

provides an ESD circuit for each pin that is used for external input/output interconnect provides, after ESD stimuli have passed through the ESD circuits, a fine-line interconnect network for further distribution of the power and ground stimuli, and the fine-line power and ground distribution network is created underneath a layer of passivation.

It must, in this respect and related to the above provided comments, be remembered that power and ground pins do not require drivers and/or receiver circuitry.

The invention:

does not need to create an ESD circuit for each pin that is used for external input/output interconnect; this in view of the more robust wiring that drives the ESD circuit, resulting in reduced power loss by an unexpected power surge over the interconnect line, resulting in more power being delivered to the ESD circuit, and allows for the power and ground interconnects to be directly connected to the internal circuits of a semiconductor device, this either without an ESD circuit or with a smaller than regular ESD circuit (as previously explained).

The method that is used to create the interconnect network that is shown in cross section in FIG. 3a addresses only the use of power and ground connections and does not apply to clock and signal interconnect lines. FIG. 3a can be summarized as follows: a silicon substrate is provided in the surface of which have been created semiconductor devices and at least one electrostatic discharge (ESD) circuit, a first layer of dielectric is deposited over the substrate, a fine-line interconnect network is created in the first layer of dielectric making contact with the active circuits and the ESD circuit. A layer of passivation is deposited over the surface of the first layer of dielectric, a pattern of metal plugs (or, for low aspect ratio vias and as previously pointed out, direct interconnects between the overlying layers of metal) is created in the layer of passivation that aligns with points of contact created in the surface of the first layer of dielectric. A second layer of dielectric is deposited over the surface of the layer of passivation, a wide thick line interconnect network is created in said the layer of dielectric, contacting the ESD circuits. A point of electrical contact comprising a power or ground contact is provided in the surface of said second layer of dielectric.

Figure 3B:
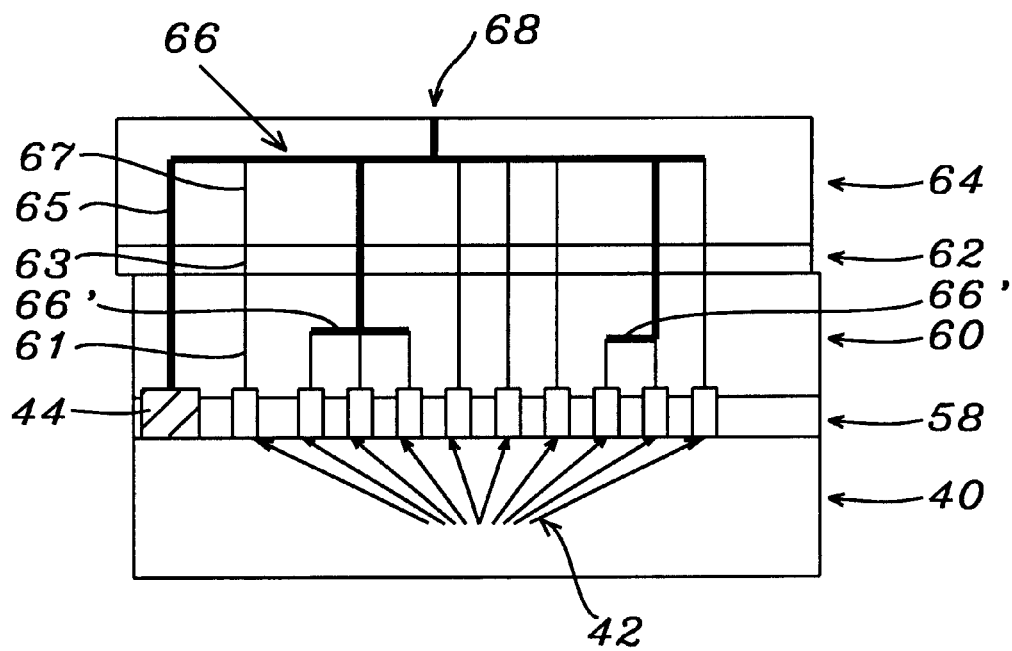
FIG. 3b differentiates between power and ground distribution lines that are below a layer of passivation and power and ground distribution lines that are above a layer of passivation.

FIG. 3b provides further insight into the creation of the power and ground interconnect lines of the invention whereby these interconnect lines have been shown as interconnect lines 66 and interconnect lines 66'. Interconnect lines 66 have been created above the layer 62 of passivation and act as global power and ground interconnect lines. Interconnect lines 66' have been created below the layer 62 of passivation and act as local power and ground interconnect lines.

Figure 4A:
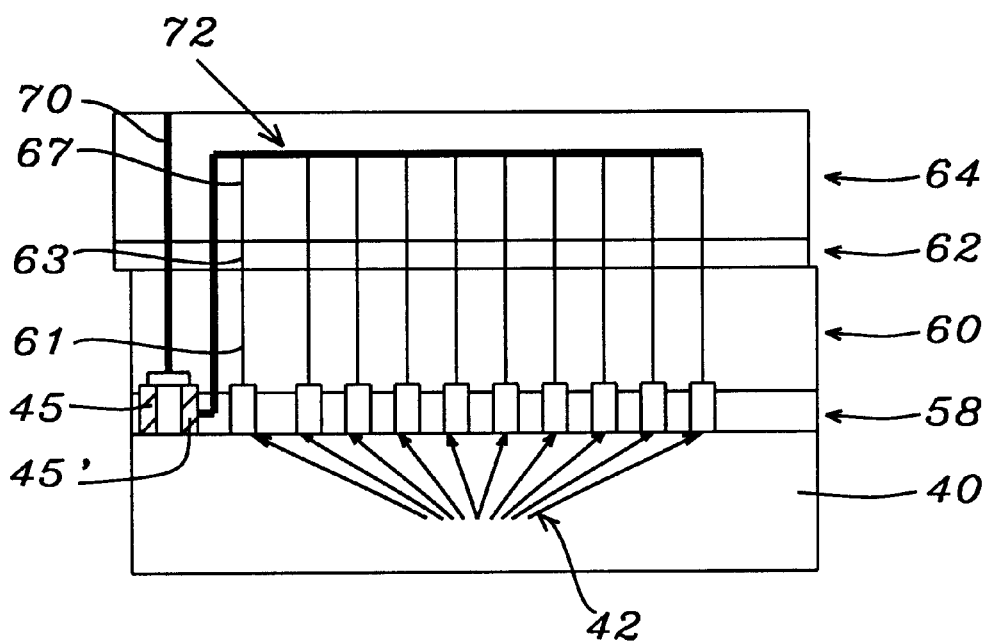
FIG. 4a is a cross section of a silicon substrate over which an interconnect network is created according to the invention. An ESD and/or driver and/or receiver circuit access pin is provided through the surface of the layer of dielectric for external connection. The structure that is shown in cross section in FIGS. 4a and 4b addresses only and is limited to clock and signal distribution networks of the invention.

Referring now to FIG. 4a, FIG. 4a addresses the interconnections of signal and clock line. In FIG. 4a there is shown is a cross section of a silicon substrate 40 over which an interconnect network is created according to the invention. An access pin to an ESD circuit or driver or receiver circuits or I/O circuits is provided through the surface of the layer of dielectric for external connection. While an ESD circuit is required for all circuits to which an I/O connection is established and independent of the type of circuit to which the I/O connection is established, the I/O interconnect can also be provided to a receiver circuit or a driver circuit or an I/O circuit.

The not previously highlighted features that are shown in FIG. 4a are:

the invention provides a interconnect network comprising wide, thick interconnect lines for distribution of the clock and signal stimuli the invention creates a interconnect network of thick, wide interconnect lines for the clock and signal stimuli overlying a layer of passivation, 70 is an external connection (pin) that is provided for the ESD circuit 45 and for driver/receiver/I/O circuit 45', pin 70 provides external access for clock and signal stimuli to circuits 45 and 45', and 72 is a clock or signal bus that is created in the interconnect layer 64 using thick, wide wires for interconnect lines; it must be noted that the clock and signal interconnect line distribution is entirely contained within the layer 64 without providing an external point of I/O interconnect.

The method that is used to create the interconnect network that is shown in cross section in FIG. 4a can be summarized as follows. A silicon substrate is provided, active circuits have been created in the surface of the substrate including an ESD, receiver, driver and I/O circuit. First layers of dielectric of inorganic material are deposited over the substrate, a fine-line interconnect network is created in the layers of dielectric, making contact with the active circuitry. A layer of passivation is deposited over the first thin layers of dielectric, a pattern of metal plugs is created in the layer of passivation (or, for low aspect ratio openings, direct contact is established between overlying layers of metal through an opening in an interposed layer of dielectric), the metal interconnects align with points of electrical contact in the surface of the first layers of dielectric. One or more thicker layers of dielectric are deposited over the surface of the layer of passivation, typically of an organic material, a wide thick line interconnect network is created in the thicker layer of dielectric, making electrical contact with the metal plugs or the metal pads in or under the layer of passivation, including to the one ESD, receiver, driver or I/O circuit. A point of electrical contact is provided in the surface of the second layer of dielectric to the ESD, receiver, driver or I/O circuit.

Figure 4B:
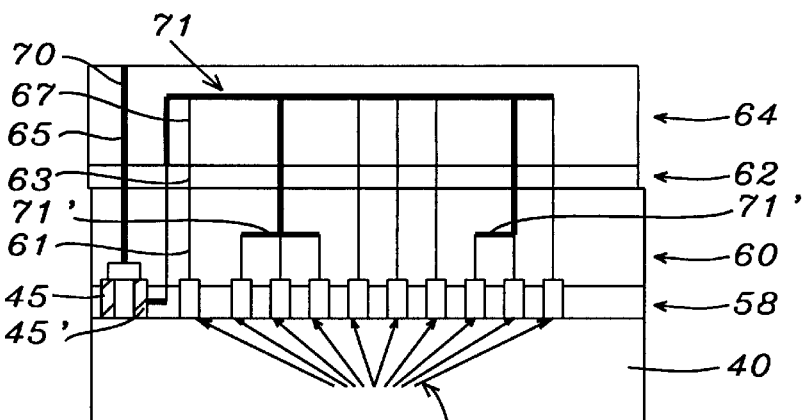
FIG. 4b differentiates between clock and signal distribution lines that are below a layer of passivation and clock and signal distribution lines that are above a layer of passivation.

FIG. 4b provides further insight into the creation of the signal and clock interconnect lines of the invention whereby these interconnect lines have been shown as interconnect lines 71 and interconnect lines 71'. Interconnect lines 71 have been created above the layer 62 of passivation and act as global signal and clock interconnect lines. Interconnect lines 71' have been created below the layer 62 of passivation and act as local signal and clock interconnect lines.

Figure 5A:
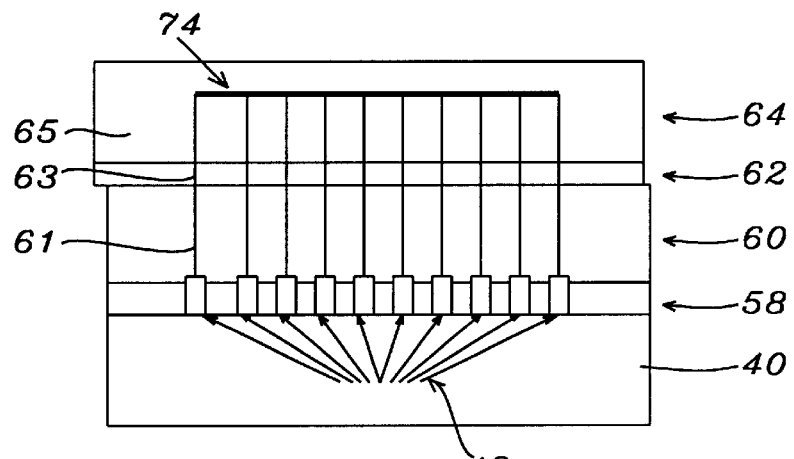
FIG. 5a is a cross section of a silicon substrate over which an interconnect network is created according to the invention. No I/O connect pin is provided through the surface of the layer of dielectric for external connection. The structure that is shown in cross section in FIGS. 4a and 4b addresses only and is limited to clock and signal distribution networks of the invention.

FIG. 5a shows a cross section of a silicon substrate 40 over which a interconnect network is created according to the invention, with the interconnect network created in a thick layer of dielectric overlying a layer of passivation and remaining internal to the thick layer of dielectric. No ESD, receiver, driver or I/O circuit access pin is provided through the surface of the layer of dielectric for external connection. Shown in FIG. 5a and not previously highlighted is the clock or signal interconnect line 74, providing for an interconnect scheme of thick, wide lines overlying a passivation layer whereby no external I/O connections are provided. Due to the thick, wide lines of the interconnect network that is created overlying a passivation layer, the clock and signal distribution can take place entirely within the interconnect layer 64, this as opposed to prior art methods where, for clock and signal distribution lines, each thick, wide interconnect line (where such thick, wide interconnect lines are used) must be provided with at least one I/O connect point for off-chip connection.

The method that is used to create the wide thick line interconnect lines that is shown in cross section in FIG. 5a can be summarized as follows and is similar to that described above for FIG. 4a. A silicon substrate is provided, active devices have been provided in the surface of the substrate. First thin layers of dielectric are deposited over the surface of the substrate, a fine-line interconnect network is created in the first layers of dielectric comprising fine-line interconnect lines, making contact with points of electrical contact in the surface of the substrate. A layer of passivation is deposited over the surface of the first layers of dielectric, a pattern of conductive interconnects is created in the layer of passivation that aligns with the points of electrical contact in the surface of the first layer of dielectric. One or more second layers of dielectric are deposited over the surface of the layer of passivation, making electrical contact with the conductive interconnects in the layer of passivation.

Figure 5B:
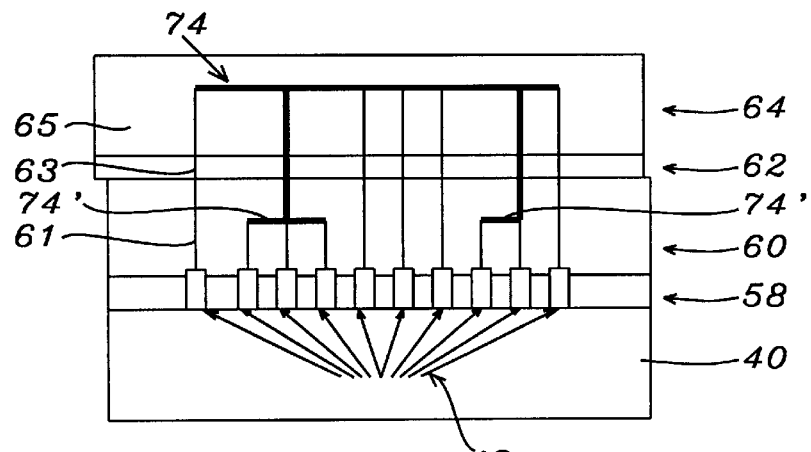
FIG. 5b differentiates between clock and signal distribution lines that are below a layer of passivation and clock and signal distribution lines that are above a layer of passivation.

FIG. 5b provides further insight into the creation of the signal and clock interconnect lines of the invention whereby these interconnect lines have been shown as interconnect lines 74 and interconnect lines 74'. Interconnect lines 74 have been created above the layer 62 of passivation and can act as global signal and clock interconnect lines. Interconnect lines 74' have been created below the layer 62 of passivation and act as local signal and clock interconnect lines.

It must further be emphasized that, where FIGS. 3–5 show a fine-line interconnect network 60 that underlies the layer 62 of passivation, the invention also enables and can be further extended with the complete elimination of the fine-line interconnect network 60 and creating an interconnect network 64 that uses only thick, wide wires. For this application of the invention, the first layer of dielectric 60 is not applied, the layer 62 of passivation is deposited directly over the surface of the created semiconductor devices 58 in or on the surface of substrate 40.

It is further of value to briefly discuss the above implemented and addressed distinction between fine-line interconnect lines and wide, thick interconnect lines. The following points apply in this respect:

- the prior art fine line interconnect lines are created underneath a layer of passivation, the wide, thick interconnect lines of the invention are created above a layer of passivation
- the fine-line interconnect lines are typically created in a layer of inorganic dielectric, the thick wide interconnect lines are typically created in a layer of dielectric comprising polymer. This because an inorganic material cannot be deposited as a thick layer of dielectric because such a layer of dielectric would develop fissures and crack as a result
- fine-line interconnect metal is typically created using methods of sputter with resist etching or of damascene processes using oxide etch with electroplating after which CMP is applied. Either one of these two approaches cannot create thick metal due to cost considerations or oxide cracking
- thick, wide interconnect lines can be created by first sputtering a thin metal base layer, coating and patterning a thick layer of photoresist, applying a thick layer of metal by electroplating, removing the patterned photoresist and performing metal base etching (of the sputtered thin metal base). This method allows for the creation of a pattern of very thick metal, metal thickness in excess of 1 $\mu$m can in this manner be achieved while the thickness of the layer of dielectric in which the thick metal interconnect lines are created can be in excess of 2 $\mu$m.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A post passivation interconnect structure, comprising:
   one or more internal circuits comprising one or more active devices formed in and on a semiconductor substrate;
   one or more ESD circuits formed in and on said semiconductor substrate;
   a fine line metallization system, formed over said semiconductor substrate in one or more thin layers of dielectric;
   a passivation layer over said fine line metallization system;
   a thick, wide metallization system formed above said passivation layer, in one or more thick layers of dielectric, wherein said thick layers of dielectric are thicker than said thin layers of dielectric, wherein said thick, wide metallization system is used as a distribution network for an electrical stimulus, and wherein said thick, wide metallization system is connected to said one or more ESD circuits, said one or more internal circuits, and to at least one off-chip contact pin.

2. The interconnect structure of claim 1 wherein said distribution network is connected to said ESD circuits and to said one or more internal circuits by vias, which are formed through said one or more thick layers of dielectric, through said passivation layer, and through said one or more thin layers of dielectric.

3. The interconnect structure of claim 2 wherein said electrical stimulus comprises a power or ground voltage.

4. The interconnect structure of claim 3 wherein said ESD circuit is connected in parallel with said one or more internal circuits, through said distribution network.

5. The interconnect structure of claim 3 wherein said distribution network acts as a global distribution for said power or ground voltages, and said vias are further connected to local power/ground distribution networks formed in said fine line metallization system.

6. The interconnect structure of claim 2 wherein said electrical stimulus comprises a clock or signal voltage.

7. The interconnect structure of claim 6, further comprising driver, receiver or I/O circuits connected in series between said one or more off-chip contact pins and said distribution network.

8. The interconnect structure of claim 7 wherein said ESD circuit is connected in parallel with said driver, receiver or I/O circuits.

9. The interconnect structure of claim 6 wherein said distribution network acts as a global distribution for said clock or signal voltages, and said vias are further connected to local clock/signal distribution networks formed in said fine line metallization system.

10. The interconnect structure of claim 1 wherein metal in said thick, wide metallization system is greater than about 1 micrometer in thickness.

11. The interconnect structure of claim 1 wherein said one or more thick layers of dielectric are each greater than about 2 micrometers in thickness.

12. A post passivation interconnect structure, comprising:
one or more internal circuits comprising one or more active devices formed in and on a semiconductor substrate;
one or more ESD circuits formed in and on said semiconductor substrate;
a fine line metallization system, formed over said semiconductor substrate in one or more thin layers of dielectric;
a passivation layer over said fine line metallization system;
a thick, wide metallization system formed above said passivation layer, in one or more thick layers of dielectric,
wherein said thick layers of dielectric are thicker than said thin layers of dielectric, wherein said thick, wide metallization system is used as a power or ground distribution network for a power or ground input, respectively, and wherein said thick, wide metallization system is connected to said one or more internal circuits, and to at least one off-chip contact pin.

13. The interconnect structure of claim 12 further comprising one or more ESD circuits, formed in and on said semiconductor substrate, connected to said distribution network, and in parallel with said one or more internal circuits.

14. The interconnect structure of claim 13 wherein said distribution network is connected to said ESD circuits and to said one or more internal circuits by vias, which are formed through said one or more thick layers of dielectric, through said passivation layer, and through said one or more thin layers of dielectric.

15. The interconnect structure of claim 12 wherein said distribution network acts as a global distribution for said power or ground inputs, and said vias are further connected to local power/ground distribution networks formed in said fine line metallization system.

16. The interconnect structure of claim 13 wherein there is one or more ESD circuit for each said off-chip contact pin.

17. The interconnect structure of claim 12 wherein metal in said thick, wide metallization system is greater than about 1 micrometer in thickness.

18. The interconnect structure of claim 12 wherein said one or more thick layers of dielectric are each greater than about 2 micrometers in thickness.

19. A post passivation interconnect structure, comprising:
one or more internal circuits comprising one or more active devices formed in and on a semiconductor substrate;
a fine line metallization system, formed over said semiconductor substrate in one or more thin layers of dielectric;
a passivation layer over said fine line metallization system;
a thick, wide metallization system formed above said passivation layer, in one or more thick layers of dielectric,
wherein said thick layers of dielectric are thicker than said thin layers of dielectric, wherein said thick, wide metallization system is used as a distribution network for a clock or signal voltage, and wherein said thick, wide metallization system is connected to said one or more internal circuits.

20. The interconnect structure of claim 19 wherein said distribution network is connected to said one or more internal circuits by vias, which are formed through said one or more thick layers of dielectric, through said passivation layer, and through said one or more thin layers of dielectric.

21. The interconnect structure of claim 20 wherein said distribution network acts as a global distribution for said clock or signal voltages, and said vias are further connected to local clock or signal distribution networks, respectively, formed in said fine line metallization system.

22. The interconnect structure of claim 19 wherein metal in said thick, wide metallization system is greater than about 1 micrometer in thickness.

23. The interconnect structure of claim 19 wherein said one or more thick layers of dielectric are each greater than about 2 micrometers in thickness.

* * * * *